(12) United States Patent
Chen et al.

(10) Patent No.: US 6,515,312 B1
(45) Date of Patent: Feb. 4, 2003

(54) METHOD FOR PACKAGING ORGANIC ELECTROLUMINESCENT DEVICE

(75) Inventors: Hsueh-Wen Chen, Taichung Hsien; Chin-Pei Huang, Kaoshiung; Kuang-Jung Chen, Taipei, all of (TW)

(73) Assignee: Windell Corporation, Taichung Hsien (TW)

( * ) Notice: Subject to any disclaimer, the term of this patent is extended or adjusted under 35 U.S.C. 154(b) by 35 days.

(21) Appl. No.: 10/007,098

(22) Filed: Dec. 3, 2001

(51) Int. Cl.[7] .................................... H01L 33/100
(52) U.S. Cl. .................... 257/99; 257/100; 264/272.17
(58) Field of Search .................. 257/200, 99, 100; 264/272.17; 438/28, 26

(56) References Cited

U.S. PATENT DOCUMENTS 6,106,259 A * 8/2000 Lee et al. ................... 425/116
6,383,664 B2 * 7/2002 Bernius et al. ............. 428/690
2001/0033135 A1 * 10/2001 Duggal et al. ............. 313/506
2002/0001050 A1 * 1/2002 Pope .......................... 349/65
2002/0063525 A1 * 5/2002 Choi et al. .................. 313/582

* cited by examiner

Primary Examiner—Olik Chaudhuri
Assistant Examiner—William C Vesperman

(57) ABSTRACT

A method for packaging organic electroluminescent (EL) elements comprises the steps including: forming a plurality of organic EL devices on a transparent substrate; laying a plurality of binding layers on a plastic laminated board to form a plastic package laminated board; forming a plurality of cavity domains on the plastic laminated board to serve for a plurality of package cans; and binding a lateral face of the package can. By doing the above said, the organic EL devices are packaged and segregated from outside ambient atmosphere with relatively longer lifetime.

17 Claims, 2 Drawing Sheets

METHOD FOR PACKAGING ORGANIC ELECTROLUMINESCENT DEVICE

FIELD OF THE INVENTION

This invention relates to a method for packaging internal devices of an organic light-emitting diode (OLED), particularly for packaging the substrate of an organic electroluminescent (EL) thin-film layer and a package can together compactly.

BACKGROUND OF THE INVENTION

An organic electroluminescent (EL) device is substantially an device in layer structure, wherein a thin film of the layer structure is usually formed on a vitreous or plastic substrate. The basic structure of the EL devices comprises a cathode, an anode, and an organic EL material layer interpolated between the cathode and the anode. A hole injection layer and a hole transfer layer are formed on one end of the EL material layer adjacent to the anode, and an electron injection layer and an electron transfer layer are formed on the other end of the EL material layer adjacent to the cathode so that both the holes at the anode and the electrons at the cathode can flow to reach the EL material layer to reunite each other and release energy in form of light.

Whereas the organic EL devices is a self-lighting body with high resolvability and excellent impact resistivity, it is considered a promising pixel devices for display of patterns. Besides, the organic EL devices is also featured in high brightness operable under a relatively lower working voltage and in proportional to the infused current, and by changing the material of an illuminable fluorescent' layer of the EL devices, it is possible to display various visible colors.

In order to facilitate injection of electrons, the cathode of the organic EL devices is usually made of a low working functional material, which unfortunately easily incurs oxidation of the cathode and accordingly retardation of the devices efficiency. Moreover, the mentioned illuminable fluorescent layer, the hole and the electron injection layer, and the hole and electron transfer layer are very sensitive to wet, oxygen, and some environmental factors and are liable to become crystallized to have the organic EL material layer detached from the cathode, namely the so-called "black point" phenomenon, when they are encountered. Hence, for avoiding occurrence or constraining growth of the "black point", inside of a conventional EL devices must be dehydrated at all possibilities, otherwise, the lifetime thereof would be greatly shortened in the case of an imperfect package.

An average package can implemented in the packaging process is a metallic can that not only costs relatively higher but also weighs heavier than other materials and is more possibly to be oxidized. In addition, the boundary to be sealed between the metallic package can and the substrate is usually not well flush and the package can must be filled in a jig one after another during the packaging process that requires more labor and time cost with poor binding quality.

Another kind of the package can is a vitreous can, which is fragile and more difficult for molding addition to those defects found in the metallic package can.

For improvements, this invention provides a method for packaging organic electroluminescent (EL) element shown in FIG. 1, wherein an organic EL devices of this invention is formed by:

forming an Indium-Tin oxide (ITO) anode layer 12 on a transparent substrate forming an organic film 13 on the ITO anode layer 12;

forming a cathode layer 14 on the organic film 13, wherein the cathode layer 14 acts to feature as a low working function;

forming a binding layer 16 to a plastic laminated board 15 which may be preset with a waterproof and oxygen-proof segregated membrane 15a; and packaging the organic EL devices in an ambient inert gas 17.

SUMMARY OF THE INVENTION

The primary object of this invention is to provide a method for packaging organic electroluminescent (EL) element that can avoid exposing an EL devices to ambient atmosphere. Another object of this invention is to prolong the lifetime of an organic EL devices. Yet another object of this invention is to provide a relatively simpler method for packaging an organic EL devices in high efficiency.

In order to realize above said objects, the method of this invention for packaging organic EL devices comprises:

forming a plurality of organic EL devices on a transparent substrate;

laying a plurality of binding layers on a plastic laminated board to form a plastic package laminated board;

forming a plurality of cavity domains on the plastic laminated board to serve for a plurality of package cans; and binding a lateral face of the package can, namely a lateral face of the plastic laminated board having the binding layers, together with a lateral face of the transparent substrate having the organic EL devices, then drying and hardening the binding layers to form a packaged body by way of thermal heating or UV-curing so as to segregate the inside organic EL devices from the outside ambient atmosphere.

In this method, an active organic material is applied to form a uniform membrane on a transparent substrate, then a thin film of electrode material, usually an alloy of Mg/Ag or LiF/Al, is formed on the uniform membrane. A material of thermal-curing, thernal-plastic, or UV-curing is adopted for coating to obtain a waterproof and oxygen-resist laminated board, which is then punched or roll-pressed to become an indented board with cavity domains, wherein the indented configuration is adopted to avoid contact with the organic layers of the inside EL devices and the package cans to the electrode layer in order not to destroy the EL devices. And, in the environment of an inert gas, the package can is combined with the EL-elements resided transparent substrate to segregate the formed organic layers from the outside ambient atmosphere.

For more detailed information regarding advantages or features of this invention, at least an example of preferred embodiment will be elucidated below with reference to the annexed drawings.

DETAILED DESCRIPTION OF THE PREFERRED EMBODIMENT

As illustrated in FIG. 2 through FIG. 7, a method for packaging organic electroluminescent (EL) element comprises following steps: a step for forming an organic EL devices, a step for forming a plastic package laminated board, a step for forming a package can with indented profile, and a step for binding a package body.

Figure 2:
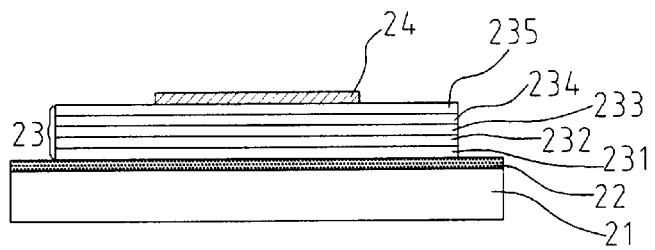
FIG. 2 shows a layer structure of the organic EL devices shown in FIG. 1.
Figure 3:
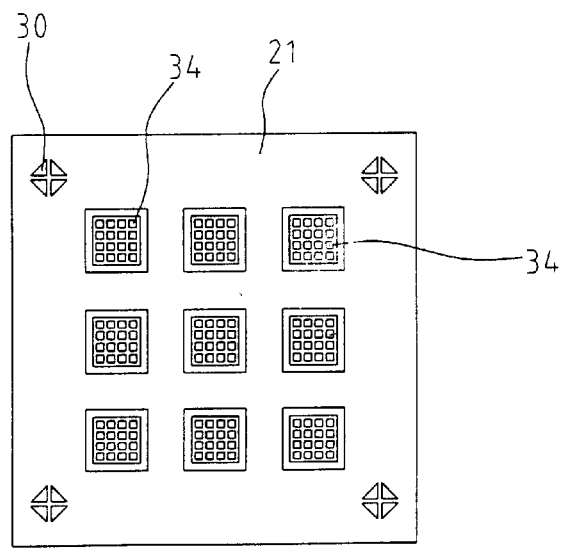
FIG. 3 shows a substrate whereon a plurality of organic LED (OLED) is disposed.

The step for forming, an organic EL devices is to provide a transparent substrate 21 with a plurality of organic EL devices 34 disposed thereon. As indicated in FIG. 2, such an architecture comprises substantially the organic EL devices 34 and some organic materials in an packaging structure, wherein an Indium-Tin oxide (ITO) anode layer 22 is formed on a transparent substrate 21; and on the ITO anode layer 22, a hole-infusing layer 231, a hole-transfer layer 232, a light layer 233, an electron-transfer layer 234, an electron-infusing layer 235, and an electrode layer 24 are sequentially formed one on another. In FIG. 3, a plurality of positioning marks 30 is punched on the transparent substrate 21, whereon the organic EL devices 34 is formed, and in the packaging process, the organic EL devices 34 must be entirely immersed in an ambient inert gas and meanwhile refrained from touching a package can.

Figure 4:
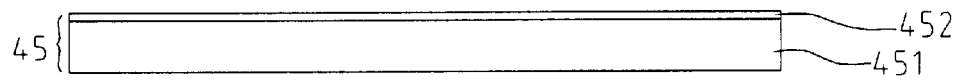
FIG. 4 shows a plastic packaging laminated board, whereon a waterproof and oxygen-proof segregated membrane is formed.

The step for forming a plastic package laminated board is to provide a plastic package laminated board having a plurality of binding layers formed thereon. As illustrated in FIG. 4, a waterproof and oxygen-resist barrier layer 452 is laid on a plastic laminated board 451 in advance to form a plastic package laminated board 45. The plastic package laminated board 45 is a flexible board to be glued with a binder by way of screen-print, letterpress, spin-coat, roller, spray or dispenser then patterned by punching or roll-pressing to create the profile of a waterproof and oxygen-resist package can.

Figure 5:
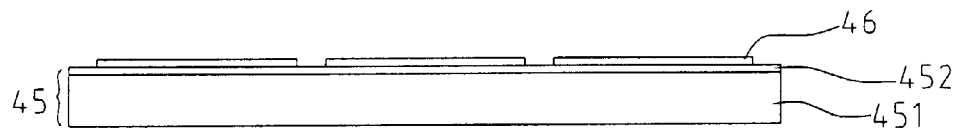
FIG. 5 is a cross sectional view showing the structure of a binding layer pattern formed on the plastic packaging laminated board.

According to FIG. 5, before a plurality of package cans is formed on the plastic package laminated board 45 of this invention, the barrier layer 452 is coated by screen-print or letterpress to form a plurality of patterned binding layers 46 which is made of either a thermal-curing or a thernal-plastic material which must be treated with care during heating because of its low Tg value. The binding layers 46 may be treated alternatively by UV (Ultraviolet) curing with proper radiation energy lest the organic EL devices is gradually deteriorated or the package is getting fragile.

Figure 6:
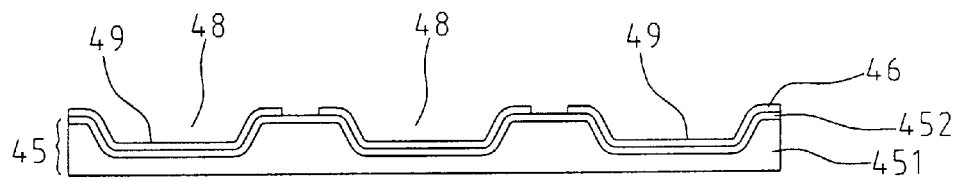
FIG. 6 is a sectional view showing the indented profile of a bound pattern on the plastic packaging laminated board after punching or roll-pressing.

The step for forming a package can with indented profile is to form a plurality of cavity domains on the plastic package laminated board 45 as shown in FIG. 6. The binding layers 46 of the plastic package laminated board 45 are punched to form a plurality of cavity domains 48 thereon to serve for a plurality of package cans 49, wherein the cavity in each cavity domain is about 50~200 $\mu$m deep to thereby accommodate the organic EL devices in the cavity domains 48 so that each organic EL devices is prevented from touching any package can 49.

Figure 7:
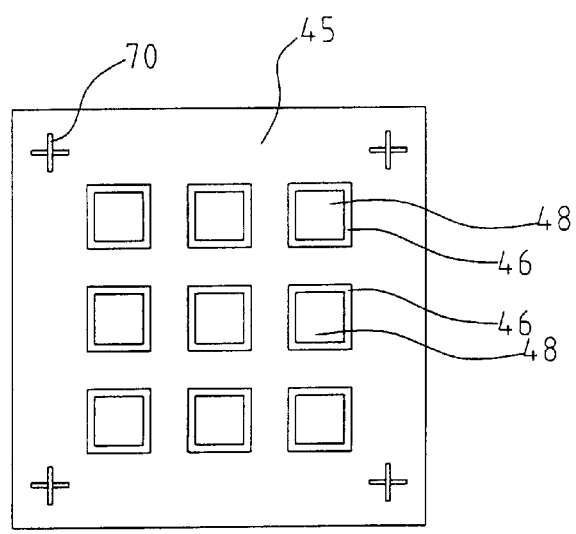
FIG. 7 is a sectional view of the plastic packaging laminated board that has been coated with a waterproof and oxygen-proof segregated membrane for serving as a package can.

The step for binding a package body is to bind a lateral face of the package can, namely a lateral face of the plastic laminated board having the binding layer, together with a lateral face of the transparent substrate having the organic EL devices, then the binding layer is heated or treated with ultraviolet rays to get cured to form a packaged body, in which the inside organic EL devices is segregated from the outside ambient atmosphere. In FIG. 7, the cavity domains 48 are designed to match the organic EL devices 34 in shape and magnitude shown in FIG. 3, and a plurality of positioning marks 70 punched on the plastic package laminated board 45, which is punched or roll-pressed to serve for package cans, is to match the positioning marks 30 of the transparent substrate 21 so that the cavity domains 48 of the binding layer 46 can be bound together correspondingly and precisely for packaging the organic EL devices 34.

Figure 1:
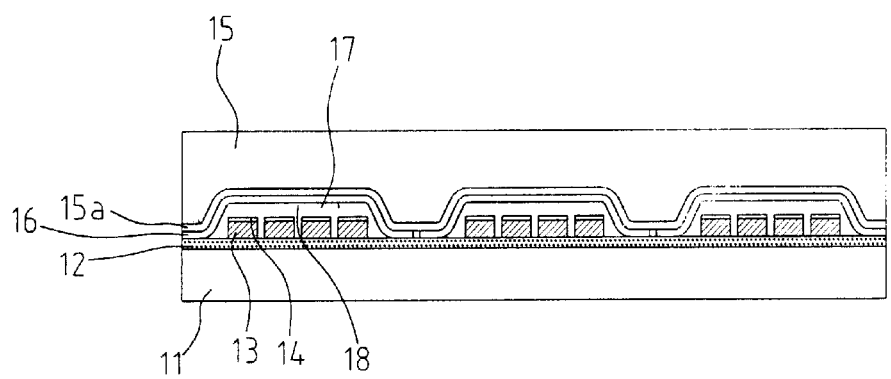
FIG. 1 is a cross sectional view of organic EL devices of this invention.

As illustrated in FIG. 1 a package structure of the organic EL devices of this invention comprises: a transparent substrate 11 having a plurality of organic EL devices disposed thereon; an ITO anode layer 12 formed on the transparent substrate 11; an organic film 13 formed on the anode layer 12; and a cathode layer 14 laid on the organic film 13; and a plastic laminated board 15 having a plurality of binding layers 16 and a waterproof and oxygen-proof segregated membrane 15a disposed thereon. Furthermore, a plurality of indented cavity domains 18 is formed on the plastic laminated board 15 and the binding layers 16 to serve for correspondent package cans, wherein a lateral face of each package can, namely a lateral face of the plastic laminated board having the binding layer 16, is bound together with a lateral face of the transparent substrate 11 having the organic EL devices so as to form a sealed package body with a plurality of inside organic EL devices segregated from the ambient atmosphere.

In the above described, at least one preferred embodiment has been described in detail with reference to the drawings annexed, and it is apparent that numerous variations or modifications may be made without departing from the true spirit and scope thereof, as set forth in the claims below.

What is claimed is:

1. A method for packaging organic electroluminescent (EL) element, comprising:
    forming a plurality of organic EL devices on a transparent substrate;
    laying a plurality of binding layers on a plastic laminated board to form a plastic package laminated board;
    forming a plurality of cavity domains on the plastic laminated board to serve for a plurality of package cans; and
    binding a lateral face of the package can, namely a lateral face of the plastic laminated board having the binding layers, together with a lateral face of the transparent substrate having the organic EL devices, then drying and hardening the binding layers to form a packaged body by way of thermal heating or UV-curing so as to segregate the inside organic EL devices from the outside ambient atmosphere.

2. The method according to claim 1, wherein a waterproof and oxygen-resist segregated membrane is formed on the plastic laminated board in advance.

3. The method according to claim 1, wherein the binding layers are made of a material in gel of thermal-plastic, thermal-curing, or UV-curing silicon.

4. The method according to claim 1, wherein the binding layers are formed in rings, hollows, or the whole lot by way of screen-print, letterpress, spin-coat, roller, spray or dispenser.

5. The method according to claim 1, wherein the cavity domains are formed on the plastic laminated board by punching or roll-pressing.

6. The method according to claim 1, wherein the number of the binding layer, the cavity domain, and the organic EL devices on the plastic laminated board are equal to each other and the positions thereof are correspondent.

7. The method according to claim 1, wherein a plurality of positioning marks of the respective transparent substrate and the plastic package laminated board must be fully coincident during forming the binding layers and the cavity domains on the plastic laminated board, which, the binding layers and the cavity domains, must coincide with the organic EL devices on the transparent substrate.

8. The method according to claim 5, wherein the cavity domains are formed by rolling with a patterned roller.

9. The method according to claim 5, wherein the cavity domains are formed by pressing with a plane mold.

10. A packaging structure formed by using the method according to claim 1, comprising:
- a transparent substrate having a plurality of organic electroluminescent (EL) elements disposed thereon;
- a plastic laminated board having a plurality of binding layers laid thereon and a plurality of cavity domains formed thereon to serve for the package cans; wherein
- a lateral face of each package can, namely a lateral face of the plastic laminated board having the binding layers, is bound together with a lateral face of the transparent substrate having the organic EL devices so as to form a sealed package body with a plurality of inside organic EL devices segregated from outside ambient atmosphere.

11. The packaging structure according to claim 10, wherein a waterproof and oxygen-resist segregated membrane is formed on the plastic laminated board in advance.

12. The packaging structure according to claim 10, wherein the binding layers are made of a material in gel of thermal-plastic, thermal-curing, or UV-curing silicon.

13. The packaging structure according to claim 10, wherein the binding layers are formed in rings, hollows, or the whole lot by way of screen-print, letterpress, spin-coat, roller, spray or dispenser.

14. The packaging structure according to claim 10, wherein the cavity domains are formed on the plastic laminated board by punching or roll- pressing.

15. The packaging structure according to claim 10, wherein the number of the binding layer, the cavity domain, and the organic EL devices on the plastic laminated board are equal to each other and the positions thereof are correspondent.

16. The packaging structure according to claim 14, wherein the cavity domains are formed by rolling with a patterned roller.

17. The packaging structure according to claim 14, wherein the cavity domains are formed by pressing with a plane mold.

* * * * *